(12) United States Patent
Zou et al.

(10) Patent No.: US 10,650,751 B2
(45) Date of Patent: May 12, 2020

(54) PIXEL DRIVING CIRCUIT AND DRIVING METHOD THEREOF, DISPLAY DEVICE

(71) Applicant: BOE TECHNOLOGY GROUP CO., LTD., Beijing (CN)

(72) Inventors: Xiangxiang Zou, Beijing (CN); Cheng Chung Yang, Beijing (CN); Yinglong Huang, Beijing (CN); Kuanjun Peng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/982,408

(22) Filed: May 17, 2018

(65) Prior Publication Data

US 2019/0073955 A1 Mar. 7, 2019

(30) Foreign Application Priority Data

Sep. 8, 2017 (CN) .......................... 2017 1 0804602

(51) Int. Cl.
*G09G 3/3208* (2016.01)
*G09G 3/3258* (2016.01)
(Continued)

(52) U.S. Cl.
CPC ......... *G09G 3/3258* (2013.01); *G09G 3/3208* (2013.01); *G09G 3/3233* (2013.01);
(Continued)

(58) Field of Classification Search
CPC .. G09G 3/3258; G09G 3/3266; G09G 3/3233; G09G 3/3208; G09G 2300/0861;
(Continued)

(56) References Cited

U.S. PATENT DOCUMENTS

2011/0115835 A1 5/2011 Lee
2012/0019498 A1* 1/2012 Jeong ................... G09G 3/3233
345/211
(Continued)

FOREIGN PATENT DOCUMENTS

CN 102063861 A 5/2011
CN 204680360 U 9/2015
(Continued)

OTHER PUBLICATIONS

First Chinese Office Action dated Jan. 4, 2019.

*Primary Examiner* — Towfiq Elahi
(74) *Attorney, Agent, or Firm* — Dilworth & Barrese, LLP.; Michael J. Musella, Esq.

(57) ABSTRACT

A pixel driving circuit and a driving method thereof, and a display device. The pixel driving circuit includes a light-emitting driving circuit, a light-emitting component and a gate-source voltage adjustment circuit. A control end, a first end and a second end of the light-emitting driving circuit are electrically connected with a first node, a second node and the light-emitting component respectively; the gate-source voltage adjustment circuit is electrically connected with at least one of the first node and the second node, the gate-source voltage adjustment circuit is also electrically connected with an adjustment voltage terminal, and the gate-source voltage adjustment circuit is configured to adjust at least one of a voltage of the first node and a voltage of the second node, so as to increase a modulus value of a voltage difference between the control end and the first end of the light-emitting driving circuit.

19 Claims, 11 Drawing Sheets

(51) Int. Cl.
*G09G 3/3233* (2016.01)
*G09G 3/3266* (2016.01)
*H01L 27/32* (2006.01)

(52) U.S. Cl.
CPC ....... *G09G 3/3266* (2013.01); *H01L 27/3262* (2013.01); *H01L 27/3265* (2013.01); *G09G 2300/0852* (2013.01); *G09G 2300/0861* (2013.01); *G09G 2310/0251* (2013.01); *G09G 2310/0262* (2013.01); *G09G 2320/0257* (2013.01)

(58) Field of Classification Search
CPC ... G09G 2310/0251; G09G 2310/0262; G09G 2320/0257; G09G 2300/0852; H01L 27/3262; H01L 27/3265
See application file for complete search history.

(56) References Cited

U.S. PATENT DOCUMENTS

| | | |
|---|---|---|
| 2015/0310834 A1 | 10/2015 | Hu et al. |
| 2016/0104427 A1 | 4/2016 | Matsueda et al. |
| 2016/0133191 A1 | 5/2016 | Kang et al. |

FOREIGN PATENT DOCUMENTS

| | | |
|---|---|---|
| CN | 105513539 A | 4/2016 |
| CN | 105789250 A | 7/2016 |
| CN | 106297645 A | 1/2017 |
| CN | 106683619 A | 5/2017 |

\* cited by examiner

0/255      short-term afterimage      48 grayscale

US 10,650,751 B2

PIXEL DRIVING CIRCUIT AND DRIVING METHOD THEREOF, DISPLAY DEVICE

The present application claims priority to Chinese patent application No. 201710804602.6, filed Sep. 8, 2017, the entire disclosure of which is incorporated herein by reference as part of the present application.

TECHNICAL FIELD

Embodiments of the present disclosure relate to a pixel driving circuit and a driving method thereof, and a display device.

BACKGROUND

Currently, in a pixel driving circuit of an organic light-emitting diode (OLED) display device, due to a magnetic hysteresis effect of a driving transistor DTFT, when the OLED display device switches to display a 48 grayscale image after displaying a black-and-white image for a period of time, an afterimage phenomenon may occur, and after a certain period of time, the afterimage phenomenon may disappear, which is a short-term afterimage phenomenon.

The magnetic hysteresis effect of the driving transistor DTFT refers to that during an operating process of the driving transistor DTFT, a certain amount of charges accumulates on a contact surface between an active layer ACT and a gate insulating layer GI of the driving transistor DTFT, and a release rate of the accumulated charges is slow, leading to that an afterimage appears during switching of non-solid color display images, and the slower the release rate of the accumulated charges is, the longer the appearance time of the afterimage is, which seriously affects visual experience of a viewer.

Therefore, how to eliminate the afterimage of the OLED display device in a display process has become a problem that needs to be solved.

SUMMARY

At least one embodiment of the present disclosure provides a pixel driving circuit, which comprises: a light-emitting driving circuit, a light-emitting component and a gate-source voltage adjustment circuit; a control end of the light-emitting driving circuit is electrically connected with a first node, a first end of the light-emitting driving circuit is electrically connected with a second node, and a second end of the light-emitting driving circuit is electrically connected with the light-emitting component; the gate-source voltage adjustment circuit is electrically connected with at least one of the first node and the second node, the gate-source voltage adjustment circuit is also electrically connected with an adjustment voltage terminal, and the gate-source voltage adjustment circuit is configured to adjust at least one of a voltage of the first node and a voltage of the second node, so as to increase a modulus value of a voltage difference between the control end and the first end of the light-emitting driving circuit.

For example, in the pixel driving circuit provided by an embodiment of the present disclosure, the gate-source voltage adjustment circuit comprises a gate-source voltage adjustment capacitor; a first end of the gate-source voltage adjustment capacitor is electrically connected with the first node, a second end of the gate-source voltage adjustment capacitor is electrically connected with the adjustment voltage terminal, and the adjustment voltage terminal is electrically connected with a previous scan line.

For example, the pixel driving circuit provided by an embodiment of the present disclosure further comprises a first reset circuit, and the first reset circuit is configured to load a voltage of a first level terminal to the first node under control of a scan signal output from a pre-previous scan line.

For example, in the pixel driving circuit provided by an embodiment of the present disclosure, the first reset circuit comprises a first transistor, a control electrode of the first transistor is electrically connected with the pre-previous scan line, a first electrode of the first transistor is electrically connected with the first level terminal, and a second electrode of the first transistor is electrically connected with the first node.

For example, in the pixel driving circuit provided by an embodiment of the present disclosure, the gate-source voltage adjustment circuit comprises a gate-source voltage adjustment capacitor, the adjustment voltage terminal is electrically connected with a light-emitting control terminal which outputs a light-emitting control signal; a first end of the gate-source voltage adjustment capacitor is electrically connected with the second node, and a second end of the gate-source voltage adjustment capacitor is electrically connected with the adjustment voltage terminal.

For example, the pixel driving circuit provided by an embodiment of the present disclosure further comprises a first reset circuit, and the first reset circuit is configured to load a voltage of a first level terminal to the first node under control of a reset signal output from a reset terminal.

For example, in the pixel driving circuit provided by an embodiment of the present disclosure, the first reset circuit comprises a first transistor, a control electrode of the first transistor is electrically connected with the reset terminal, a first electrode of the first transistor is electrically connected with the first level terminal, and a second electrode of the first transistor is electrically connected with the first node.

For example, in the pixel driving circuit provided by an embodiment of the present disclosure, the gate-source voltage adjustment circuit comprises a first transistor, and the first transistor is configured to load a voltage of the adjustment voltage terminal to the first node under control of a reset signal output from a reset terminal.

For example, in the pixel driving circuit provided by an embodiment of the present disclosure, a control electrode of the first transistor is electrically connected with the reset terminal, a first electrode of the first transistor is electrically connected with the adjustment voltage terminal, and a second electrode of the first transistor is electrically connected with the first node.

For example, the pixel driving circuit provided by an embodiment of the present disclosure further comprises a data writing circuit and a storage circuit, the data writing circuit is configured to write a data signal to the first end of the light-emitting driving circuit under control of a scan signal output from a current scan line; and the storage circuit is configured to store the data signal.

For example, in the pixel driving circuit provided by an embodiment of the present disclosure, the light-emitting driving circuit comprises a driving transistor, the storage circuit comprises a storage capacitor, and the data writing circuit comprises a third transistor; the control end of the light-emitting driving circuit is a control electrode of the driving transistor, the first end of the light-emitting driving circuit is a first electrode of the driving transistor, and the second end of the light-emitting driving circuit is a second electrode of the driving transistor; a first end of the storage capacitor is electrically connected with the first node, a second end of the storage capacitor is electrically connected with a first power voltage terminal; a first electrode of the third transistor is electrically connected with a data line to receive the data signal, a second electrode of the third transistor is electrically connected with the second node, and a control electrode of the third transistor is electrically connected with the current scan line.

For example, the pixel driving circuit provided by an embodiment of the present disclosure further comprises a light-emitting control circuit, and the light-emitting control circuit is configured to control a driving current generated by the light-emitting driving circuit to drive the light-emitting component to emit light under control of a light-emitting control signal.

For example, in the pixel driving circuit provided by an embodiment of the present disclosure, the light-emitting control circuit comprises a fourth transistor and a fifth transistor, a control electrode of the fourth transistor is electrically connected with a light-emitting control terminal which outputs the light-emitting control signal, a first electrode of the fourth transistor is electrically connected with a first power voltage terminal, and a second electrode of the fourth transistor is electrically connected with the second node; a control electrode of the fifth transistor is electrically connected with the light-emitting control terminal which outputs the light-emitting control signal, a first electrode of the fifth transistor is electrically connected with the second end of the light-emitting driving circuit, and a second electrode of the fifth transistor is electrically connected with a first electrode of the light-emitting component.

For example, the pixel driving circuit provided by an embodiment of the present disclosure further comprises a threshold compensation circuit, and the threshold compensation circuit is configured to perform threshold compensation on the light-emitting driving circuit under control of a scan signal output from a current scan line.

For example, in the pixel driving circuit provided by an embodiment of the present disclosure, the threshold compensation circuit comprises a second transistor, a control electrode of the second transistor is electrically connected with the current scan line, a first electrode of the second transistor is electrically connected with the first node, and a second electrode of the second transistor is electrically connected with the second end of the light-emitting driving circuit.

For example, the pixel driving circuit provided by an embodiment of the present disclosure further comprises a second reset circuit; and the second reset circuit is configured to load a voltage of a second level terminal to a first electrode of the light-emitting component under control of a scan signal output from a current scan line.

For example, in the pixel driving circuit provided by an embodiment of the present disclosure, the second reset circuit comprises a sixth transistor, a control electrode of the sixth transistor is electrically connected with the current scan line, a first electrode of the sixth transistor is electrically connected with the second level terminal, and a second electrode of the sixth transistor is electrically connected with the first electrode of the light-emitting component.

At least one embodiment of the present disclosure further provides a display device, comprising the pixel driving circuit provided by any one of the above embodiments of the present disclosure.

At least one embodiment of the present disclosure further provides a driving method used for the pixel driving circuit described above, comprising:

in a gate-source voltage adjustment stage, adjusting at least one of the voltage of the first node and the voltage of the second node, so as to increase the modulus value of the voltage difference between the control end and the first end of the light-emitting driving circuit; and in a light-emitting stage, controlling a driving current generated by the light-emitting driving circuit to drive the light-emitting component to emit light.

For example, the driving method provided by an embodiment of the present disclosure further comprises: in a threshold compensation stage, writing a threshold compensation signal to the control end of the light-emitting driving circuit through a threshold compensation circuit, to perform threshold compensation on the light-emitting driving circuit.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

FIG. 3b-FIG. 3e are schematic diagrams illustrating conduction of the pixel driving circuit in four stages shown in FIG. 3a;

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

For a purpose that those skilled in the art can better understand the technical solution of the present disclosure, a pixel driving circuit, a driving method thereof and a display device provided by the present disclosure will be further described in detail below with reference to the accompanying drawings and specific implementations.

Figure 1:
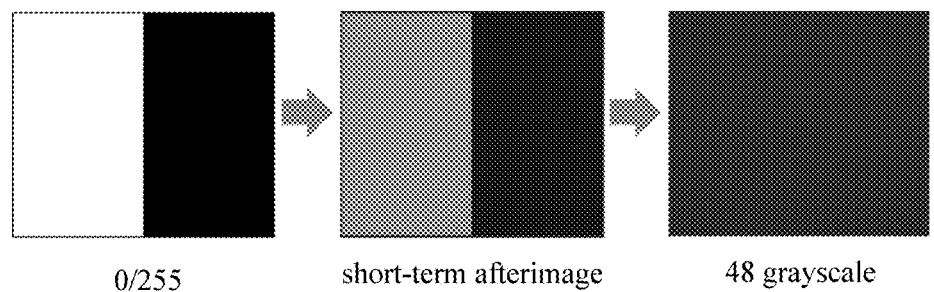
FIG. 1 is a schematic diagram illustrating appearance of a short-term afterimage when a black-and-white image is switched to a grayscale image.

For example, a magnetic hysteresis effect of a driving transistor can cause short-term afterimages. An image of a previous frame tends to be remained in an image of a next frame, which may affect display quality of an OLED display panel and even cause display errors. FIG. 1 is a schematic diagram illustrating appearance of a short-term afterimage when a black-and-white image is switched to a grayscale image, as shown in FIG. 1. For an OLED display product with a size of 14 inches, when a black-and-white image which is displayed for 10 seconds is switched to a 48 grayscale image, a short-term afterimage appears and does not disappear until 2 seconds later. A short-term afterimage of other OLED display products may not disappear until 6 seconds later, which seriously affects visual experience of a viewer.

It should be noted that, transistors in the embodiments of the present disclosure may be thin film transistors or field effect transistors or other switch elements with the same characteristics. A source electrode and a drain electrode of a transistor used herein may be symmetrical in structures, and therefore the source electrode and the drain electrode of the transistor in the embodiments of the present disclosure may be indistinguishable in physical structures. In the embodiments of the present disclosure, in order to distinguish two electrodes of the transistor except a gate electrode of the transistor, one of the two electrodes is directly described as a first electrode, and the other of the two electrodes is described as a second electrode. Therefore, the first electrode and the second electrode of all or part of the transistors in the embodiments of the present disclosure are interchangeable as needed. For example, in the embodiments of the present disclosure, a first electrode of a transistor may be the source electrode, and a second electrode of the transistor may be the drain electrode; alternatively, the first electrode of the transistor may be the drain electrode, and the second electrode of the transistor may be the source electrode. No specific distinction is made here. In addition, the transistors may be classified into N-type transistors and P-type transistors according to the characteristics of the transistors. The embodiments of the present disclosure do not limit the type of the transistors, and a person having ordinary skill in the art can implement the embodiments of the present disclosure by using N-type and/or P-type transistors according to actual needs.

The present disclosure has the following beneficial effects:

The embodiments of the present disclosure provide a pixel driving circuit and a driving method thereof, and a display device. In the pixel driving circuit provided by the present disclosure, a gate-source voltage adjustment circuit is provided to increase a modulus value of a voltage difference between the control end and the first end of the light-emitting driving circuit (namely, a voltage difference between a gate electrode and a source electrode of a driving transistor), so that accumulated charges on a contact surface between an active layer and a gate insulating layer of the driving transistor can be released quickly (that is, the driving transistor can be stabilized more quickly), thereby reducing the duration of afterimages when switching to a non-solid display image in a display process, and improving the visual experience of an user.

According to the display device provided by the present disclosure, by using the above-mentioned pixel driving circuit, the duration of the afterimages when switching to the non-solid display image in the display process of the display device is greatly shortened, so as to improve the display effect of the display device.

Figure 2:
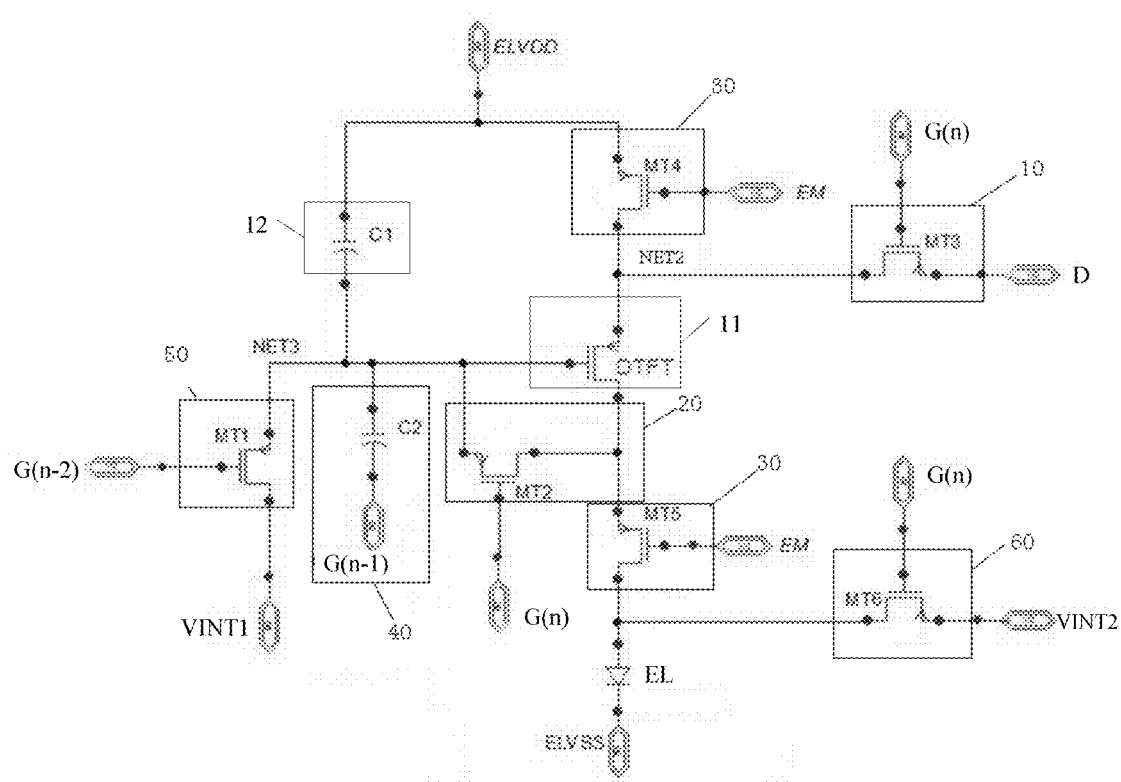
FIG. 2 is a circuit diagram of a pixel driving circuit provided by an embodiment of the present disclosure.

FIG. 2 is a circuit diagram of a pixel driving circuit provided by an embodiment of the present disclosure. Referring to FIG. 2, a pixel driving circuit provided by an embodiment of the present disclosure comprises a data writing circuit 10, a threshold compensation circuit 20, a light-emitting control circuit 30, a light-emitting driving circuit 11, a light-emitting component EL, a storage circuit 12, a gate-source voltage adjustment circuit 40, a first reset circuit 50 and a second reset circuit 60.

For example, a control end of the light-emitting driving circuit 11 is electrically connected with a first node NET3, a first end of the light-emitting driving circuit 11 is electrically connected with a second node NET2, and a second end of the light-emitting driving circuit 11 is electrically connected with the light-emitting component EL; the gate-source voltage adjustment circuit 40 is electrically connected with at least one of the first node NET3 and the second node NET2, and the gate-source voltage adjustment circuit 40 is also electrically connected with an adjustment voltage terminal.

For example, the data writing circuit 10 is configured to write a data signal to the first end of the light-emitting driving circuit 11 under control of a scan signal output from a current scan line G(n). The storage circuit 12 is configured to store the data signal.

For example, the light-emitting control circuit 30 is used to control a driving current generated by the light-emitting driving circuit 11 to drive the light-emitting component EL to emit light under control of a light-emitting control signal.

For example, the threshold compensation circuit 20 is used to perform threshold compensation on the light-emitting driving circuit 11 under the control of the scan signal output from the current scan line G(n).

For example, the gate-source voltage adjustment circuit 40 is configured to adjust at least one of a voltage of the first node NET3 and a voltage of the second node NET2, so as to increase a modulus value of a voltage difference between the control end and the first end of the light-emitting driving circuit 11. The modulus value of the voltage difference is the magnitude of the voltage difference, that is, the absolute value.

For example, the light-emitting driving circuit 11 comprises a driving transistor DTFT. The control end of the light-emitting driving circuit 11 is a control electrode of the driving transistor DTFT, the first end of the light-emitting driving circuit 11 is a first electrode of the driving transistor DTFT, and a second end of the light-emitting driving circuit 11 is a second electrode of the driving transistor DTFT.

For example, the threshold compensation circuit 20 is used to electrically connect the control electrode of the driving transistor DTFT to the second electrode of the driving transistor DTFT in a threshold compensation stage, so that the data signal can charge the first node NET3. When an electric potential of the first node NET3 is equal to a sum of the data signal and a threshold voltage of the driving transistor DTFT, the charging of the first node NET3 is stopped, thereby achieving compensating for the threshold voltage of the driving transistor DTFT.

For example, the first electrode of the driving transistor DTFT is a source electrode, the second electrode of the driving transistor DTFT is a drain electrode, and the control electrode of the driving transistor DTFT is a gate electrode. The voltage difference between the control end and the first end of the light-emitting driving circuit 11 is a voltage difference between the gate electrode and the source electrode of the driving transistor DTFT (hereafter referred to as a gate-source voltage).

For example, if the driving transistor DTFT in the pixel driving circuit is a P-type transistor (for example, a PMOS transistor), the driving transistor DTFT is turned on when a signal of the control electrode of the driving transistor DTFT is at a low level (a negative level). Therefore, the gate-source voltage adjustment circuit 40 can increase the modulus value of the gate-source voltage Vgs=Vg–Vs of the driving transistor DTFT by pulling down the voltage of the first node NET3 (for example, the voltage is pulled down from –2V to –5V). That is, the gate-source voltage adjustment circuit 40 may increase the modulus value of the gate-source voltage Vgs of the driving transistor DTFT by pulling down the gate voltage Vg of the driving transistor DTFT. If assuming that the source voltage of the driving transistor DTFT is Vs=0V, and the voltage of the first voltage NET3 is –2V, namely the gate voltage of the driving transistor DTFT is Vg=–2V, then an initial value of the gate-source voltage Vgs is –2V. In a case that the gate-source voltage adjustment circuit 40 pulls down the voltage of the first node NET3 from –2V to –5V, the gate-source voltage Vgs is –5V, that is, the gate-source voltage Vgs is changed from –2V to –5V, so as to increase the modulus value of the gate-source voltage Vgs.

Similarly, if the driving transistor DTFT in the pixel driving circuit is a P-type transistor, the gate-source voltage adjustment circuit 40 can increase the modulus value of the gate-source voltage Vgs=Vg–Vs of the driving transistor DTFT by pulling up the voltage of the second node NET2 (for example, the voltage is pulled up from 0V to 2V). That is, the gate-source voltage adjustment circuit 40 can increase the modulus value of the gate-source voltage Vgs of the driving transistor DTFT by pulling up the source voltage Vs of the driving transistor DTFT. Assuming that the gate voltage of the driving transistor DTFT is Vg=–2V, and the voltage of the second node NET2 is 0V, namely the source voltage of the driving transistor DTFT is Vs=0V, then the initial value of the gate-source voltage Vgs is –2V. In a case that the gate-source voltage adjustment circuit 40 pulls up the voltage of the second node NET2 from 0V to 2V, the gate-source voltage Vgs is –4V, that is, the gate-source voltage Vgs is changed from –2V to –4V, so as to increase the modulus value of the gate-source voltage Vgs.

In the pixel driving circuit provided by the embodiments of the present disclosure, the gate-source voltage adjustment circuit 40 is provided to increase the modulus value of the gate-source voltage of the driving transistor (namely the voltage difference between the gate electrode and the source electrode of the driving transistor), so that accumulated charges on a contact surface between an active layer and a gate insulating layer of the driving transistor can be released quickly (that is, the driving transistor can be stabilized more quickly), thereby reducing the duration of afterimages when switching to the non-solid display image in a display process, and improving the visual experience of an user.

For example, the gate-source voltage adjustment circuit 40 comprises a gate-source voltage adjustment capacitor C2. As shown in FIG. 2, in an example, a first end of the gate-source voltage adjustment capacitor C2 is electrically connected with the first node NET3, and a second end of the gate-source voltage adjustment capacitor C2 is electrically connected with the adjustment voltage terminal. For example, the adjustment voltage terminal is electrically connected with a previous scan line G(n–1).

For example, a control end of the first reset circuit 50 is electrically connected with a pre-previous scan line G(n–2), a first end of the first reset circuit 50 is electrically connected with the first level terminal VINT1, and a second end of the first reset circuit 50 is electrically connected with the first node NET3. The first reset circuit 50 is used to load a voltage of a first level terminal VINT1 to the first node NET3 under control of a scan signal output from a pre-previous scan line G(n–2). The pre-previous scan line denoted as G(n–2) is a scan line prior to the previous scan line G(n–1).

For example, as shown in FIG. 2, the first reset circuit 50 comprises a first transistor MT1. A control electrode of the first transistor MT1 acts as the control end of the first reset circuit 50; a first electrode and a second electrode of the first transistor MT1 act as the first end and the second end of the first reset circuit 50 respectively. That is, the control electrode of the first transistor MT1 is electrically connected with the pre-previous scan line G(n–2), and the first electrode of the first transistor MT1 is electrically connected with the first level terminal VINT1, and the second electrode of the first transistor MT1 is electrically connected with the first node NET3.

For example, as shown in FIG. 2, the threshold compensation circuit 20 comprises a second transistor MT2. A control electrode of the second transistor MT2 is electrically connected with the current scan line G(n), a first electrode of the second transistor MT2 is electrically connected with the first node NET3, a second electrode of the second transistor MT2 is electrically connected with the second end of the light-emitting driving circuit 11, that is the first electrode and the second electrode of the second transistor MT2 are electrically connected with the gate electrode and the drain electrode of the driving transistor DTFT respectively.

For example, as shown in FIG. 2, the data writing circuit 10 comprises a third transistor MT3. A control electrode of the third transistor MT3 is electrically connected with the current scan line G(n), a first electrode of the third transistor MT3 is electrically connected with a data line D to receive the data signal, and a second electrode of the third transistor MT3 is electrically connected with the second node NET2.

For example, as shown in FIG. 2, the storage circuit 12 comprises a storage capacitor C1. A first end of the storage capacitor C1 is electrically connected with the first node NET3, and a second end of the storage capacitor C1 is electrically connected with a first power voltage terminal ELVDD.

For example, as shown in FIG. 2, the light-emitting control circuit 30 comprises a fourth transistor MT4 and a fifth transistor MT5. A control electrode of the fourth transistor MT4 is electrically connected with a light-emitting control terminal EM that outputs a light-emitting control signal, a first electrode of the fourth transistor MT4 is electrically connected with the first power voltage terminal ELVDD, and a second electrode of the fourth transistor MT4 is electrically connected with the second node NET2. A control electrode of the fifth transistor MT5 is electrically connected with the light-emitting control terminal EM that outputs the light-emitting control signal, a first electrode of the fifth transistor MT5 is electrically connected with the second end of the light-emitting driving circuit 11, namely the first electrode of the fifth transistor MT5 is electrically connected with the drain electrode of the driving transistor DTFT, and a second electrode of the fifth transistor MT5 is electrically connected with a first electrode of the light-emitting component EL.

For example, the second reset circuit 60 is configured to load a voltage of a second level terminal VINT2 to the first electrode of the light-emitting component EL under the control of the scan signal output from the current scan line G(n). As shown in FIG. 2, the second reset circuit 60 comprises a sixth transistor MT6. A control electrode of the sixth transistor MT6 is electrically connected with the current scan line G(n), a first electrode of the sixth transistor MT6 is electrically connected with the second level terminal VINT2, and a second electrode of the sixth transistor MT6 is electrically connected with the first electrode of the light-emitting component EL.

For example, the first level terminal VINT1 and the second level terminal VINT2 are configured to output the same signal. However the present disclosure is not limited thereto, and the first level terminal VINT1 and the second level terminal VINT2 may also output different signals. For another example, the first level terminal VINT1 and the second level terminal VINT2 are the same level terminal.

For example, a second electrode of the light-emitting component EL is electrically connected with a second power voltage terminal ELVSS. The first electrode of the light-emitting component EL is an anode, and the second electrode of the light-emitting component EL is a cathode.

It should be noted that, in the embodiments of the present disclosure, for example, when the current scan line G(n) is an nth scan line, the previous scan line G(n−1) is a (n−1)th scan line, and the pre-previous scan line G(n−2) is a (n−2)th scan line, where n is a positive integer. In a scanning process of one frame, the (n−2)th scan line, the (n−1)th scan line, and the nth scan line are sequentially applied with a scan signal, so as to achieve a scanning operation. For example, the (n−2) the scan line is adjacent to the (n−1)th scan line, and the (n−1)th scan line is adjacent to the nth scan line. That is, when a scanning operation of the (n−2) the scan line is completed, a scanning operation of the (n−1)th scan line starts; when the scanning operation of the (n−1)th scan line is completed, a scanning operation of the nth scan line starts. If M scan lines need to be scanned in the scanning process of one frame, when n is 1, the (n−2)th scan line may represent a (M−1)th scan line, and the (n−1)th scan line may represent an Mth scan line; and when n is 2, the (n−2)th scan line may represent the Mth scan line.

In some embodiments, the first transistor MT1 to the sixth transistor MT6 and the driving transistor DTFT are all PMOS transistors, which is taken as an example to describe the present disclosure in detail, that is, a low level is an active level, and a high level is a non-active level. However, the present disclosure is not limited thereto, and at least part of the first transistor MT1 to the sixth transistor MT6 and the driving transistor DTFT in the embodiments of the present disclosure may also be NMOS transistors.

Figure 3A:
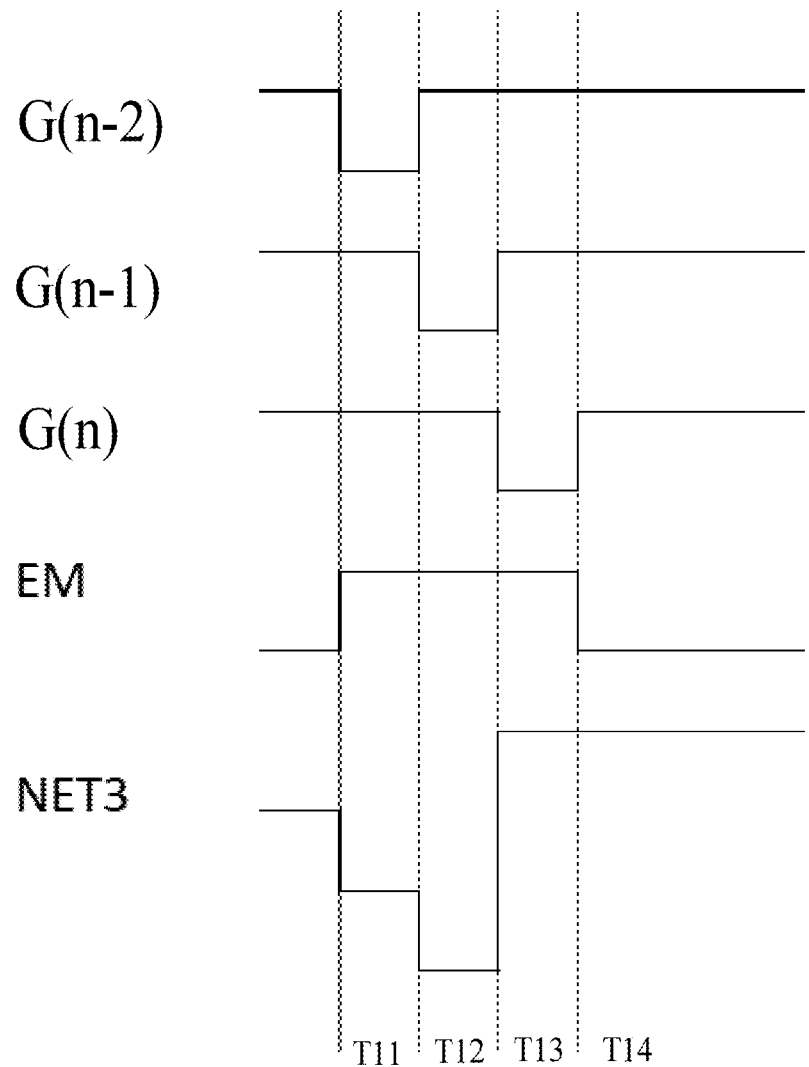
FIG. 3a is a time sequence diagram of a pixel driving circuit shown in FIG. 2.

FIG. 3a is a time sequence diagram of a pixel driving circuit shown in FIG. 2, and a driving method of the pixel driving circuit provided by an embodiment of the present disclosure is described in detail with reference to FIG. 2 and FIG. 3a.

For example, the driving method provide by an embodiment of the present disclosure comprises the following steps:

in a gate-source voltage adjustment stage T12, adjusting at least one of a voltage of the first node and a voltage of the second node, so as to increase a modulus value of a voltage difference between the control end and the first end of the light-emitting driving circuit; and in a light-emitting stage T14, controlling a driving current generated by the light-emitting driving circuit to drive the light-emitting component to emit light.

For example, the driving method may further comprise the following steps:

in a reset stage T11, resetting the control end (namely the first node) of the light-emitting driving circuit, and charging the storage circuit; and in a threshold compensation stage T13, writing a threshold compensation signal to the control end (namely the first node) of the light-emitting driving circuit through a threshold compensation circuit, to perform threshold compensation on the light-emitting driving circuit.

Figure 3B:
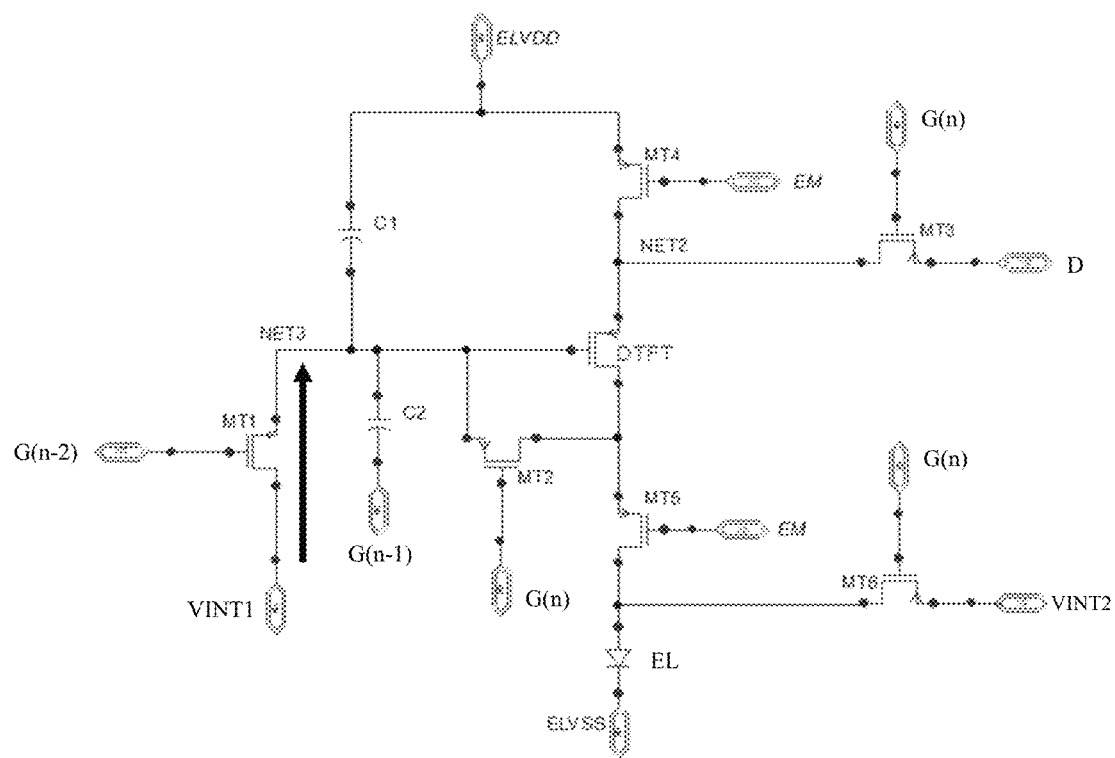

FIG. 3b is a schematic diagram of the pixel driving circuit in the reset stage T11, and an arrow in the FIG. 3b indicates a signal flow direction.

For example, as shown in FIG. 3b, in the reset stage T11, a scan signal output from the pre-previous scan line G(n−2) is a low level voltage signal, so that the first transistor MT1 is turned on. A scan signal output from the previous scan line G(n−1) is a high level voltage signal, a scan signal output from the current scan line G(n) is a high level voltage signal, and the light-emitting control signal output from the light-emitting control terminal EM is a high level voltage signal, so that other transistors (that is, the second transistor MT2 to the sixth transistor MT6) and the driving transistor DTFT are all turned off. At this time, a first reset voltage Vi1 output from the first level terminal VINT1 is transmitted to the control electrode (that is, the first node NET3) of the driving transistor DTFT through the first transistor MT1, and thus the control electrode of the driving transistor DTFT is reset. At this time, the gate voltage Vg of the driving transistor DTFT is equal to the first reset voltage Vi1, that is, Vg=Vi1. Meanwhile, the first reset voltage Vi1 output from the first level terminal VINT1 charges the storage capacitor C1 through the first transistor MT1, that is, the first reset voltage Vi1 is written into the first end of the storage capacitor C1.

Figure 3C:
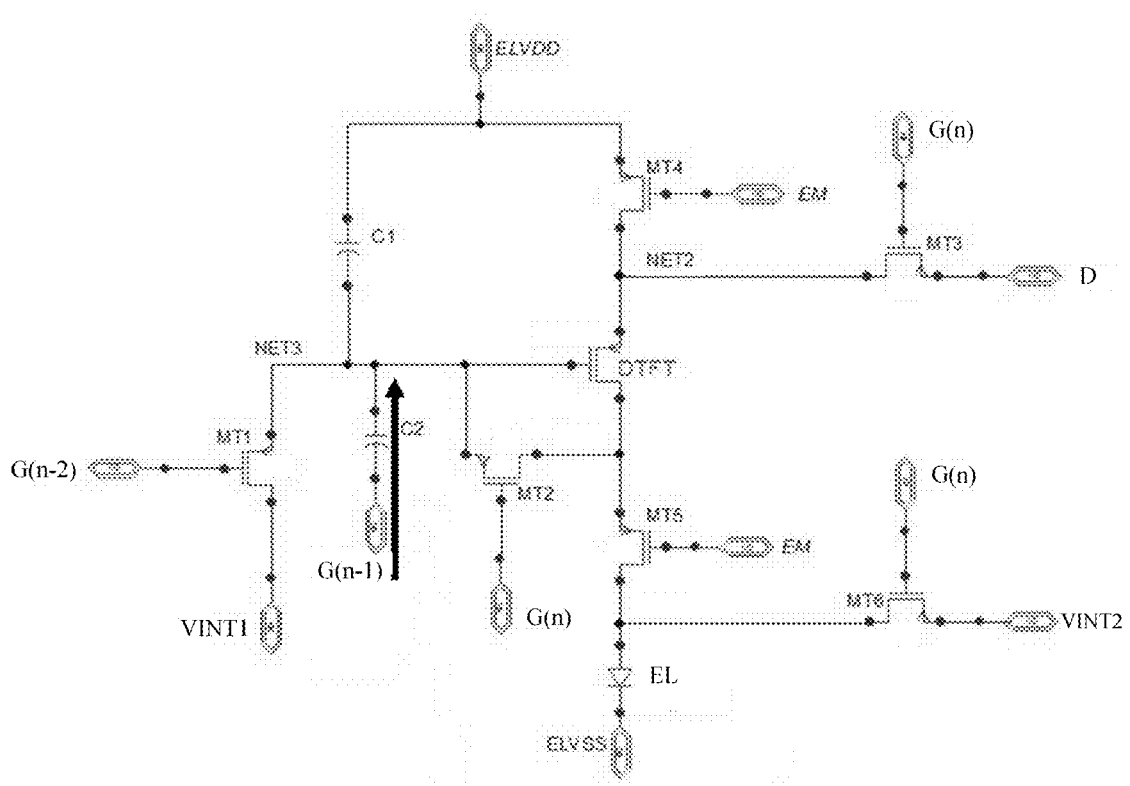

FIG. 3c is a schematic diagram of the pixel driving circuit in the gate-source voltage adjustment stage T12, and an arrow in the FIG. 3c indicates a signal flow direction.

For example, as shown in FIG. 3c, in the gate-source voltage adjustment stage T12, the scan signal output from the pre-previous scan line G(n−2) is a high level voltage signal, the scan signal output from the previous scan line G(n−1) is a low level voltage signal, the scan signal output from the current scan line G(n) is a high level voltage signal, and the light-emitting control signal output from the light-emitting control terminal EM is a high level voltage signal. At this time, all transistors (that is, the first transistor MT1 to the sixth transistor MT6) and the driving transistor DTFT are all turned off. When the scan signal output from the previous scan line G(n−1) is changed from the high level voltage signal to the low level voltage signal, the voltage of the first node NET3 is pulled down to Vi1−(Vgh−Vgl) due to the existence of the gate-source voltage adjustment capacitor C2. That is, the gate voltage of the driving transistor DTFT is Vg=Vi1−(Vgh−Vgl), and here, Vgh is the high level voltage signal in the scan signal output from the previous scan line G(n−1), and Vgl is the low level voltage signal in the scan signal output from the previous scan line G(n−1). Thus, in comparison with the reset stage T11, in the gate-source voltage adjustment stage T12, the gate voltage Vg of the driving transistor DTFT is further decreased, so that the gate-source voltage Vgs is increased, movable ions (that is, charges) at the surface between the active layer ACT and the gate insulating layer GI of the driving transistor DTFT can be eliminated in a relative short time, and the driving transistor DTFT can be stabilized more quickly, thereby ameliorating the short-term afterimage of a display panel.

Figure 3D:
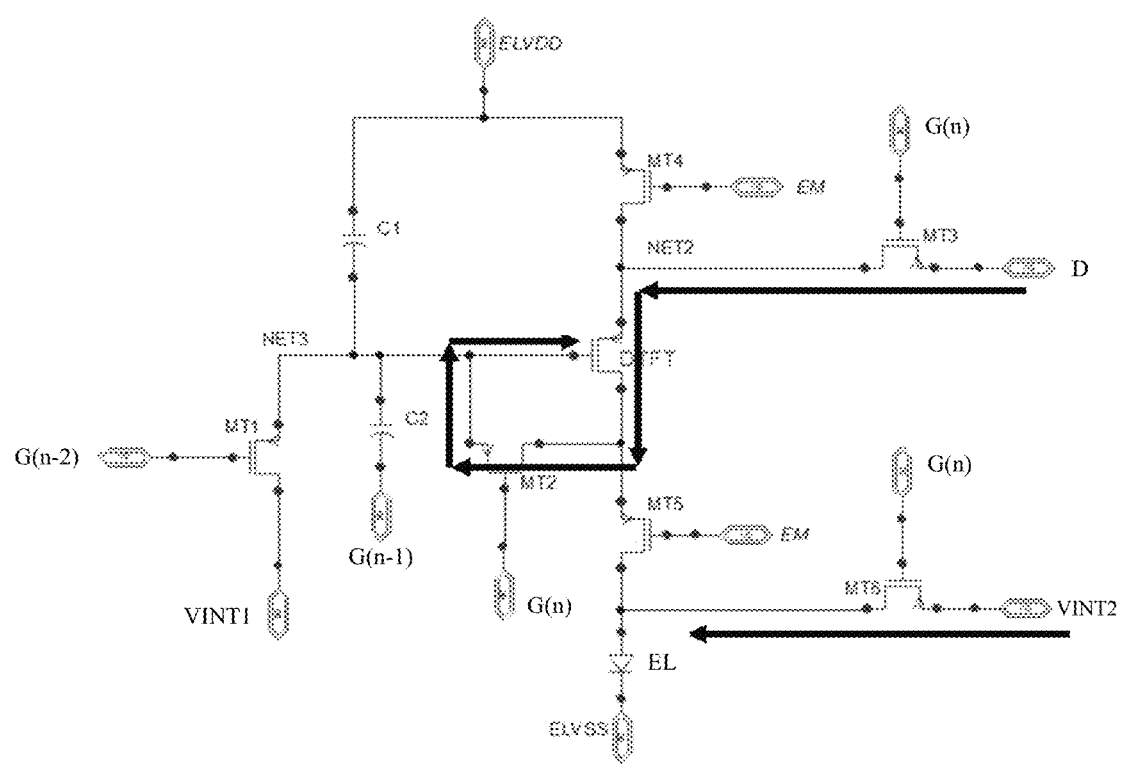

FIG. 3d is a schematic diagram of the pixel driving circuit in the threshold compensation stage T13, and an arrow in the FIG. 3d indicates a signal flow direction.

For example, as shown in FIG. 3d, in the threshold compensation stage T13, the scan signal output from the current scan line G(n) is a low level voltage signal, so that the second transistor MT2, the driving transistor DTFT, the third transistor MT3 and the sixth transistor MT6 are all turned on. The scan signal output from the pre-previous scan line G(n−2) is a high level voltage signal, the scan signal output from the previous scan line G(n−1) is a high level voltage signal, and the light-emitting control signal output from the light-emitting control terminal EM is a high level voltage signal, so that the first transistor MT1, the fourth transistor MT4 and the fifth transistor MT5 are all turned off. At this time, the data signal on the data line D continues to charge the first node NET3 via the third transistor MT3, the driving transistor DTFT, and the second transistor MT2. When the voltage of the first node NET3 is equal to the sum of the data signal and the threshold voltage of the driving transistor DTFT, the charging of the first node NET3 is stopped, and at this time, the gate voltage of the driving transistor DTFT is Vg=Vdata+Vth, so as to achieve compensation for the threshold voltage of the driving transistor DTFT. Meanwhile, because the sixth transistor MT6 is also turned on, a second reset voltage Vi2 output from a second level terminal VINT2 is transmitted to the first electrode of the light-emitting component EL through the sixth transistor MT6, so that the first electrode of the light-emitting component EL is reset, and at this time, the voltage of the first electrode of the light-emitting component EL is equal to the second reset voltage Vi2.

It should be noted that, in the threshold compensation stage T13, the voltage written to the gate electrode of the driving transistor DTFT may be the threshold compensation signal.

For example, the first reset voltage Vi1 and the second reset voltage Vi2 may be the same.

Figure 3E:
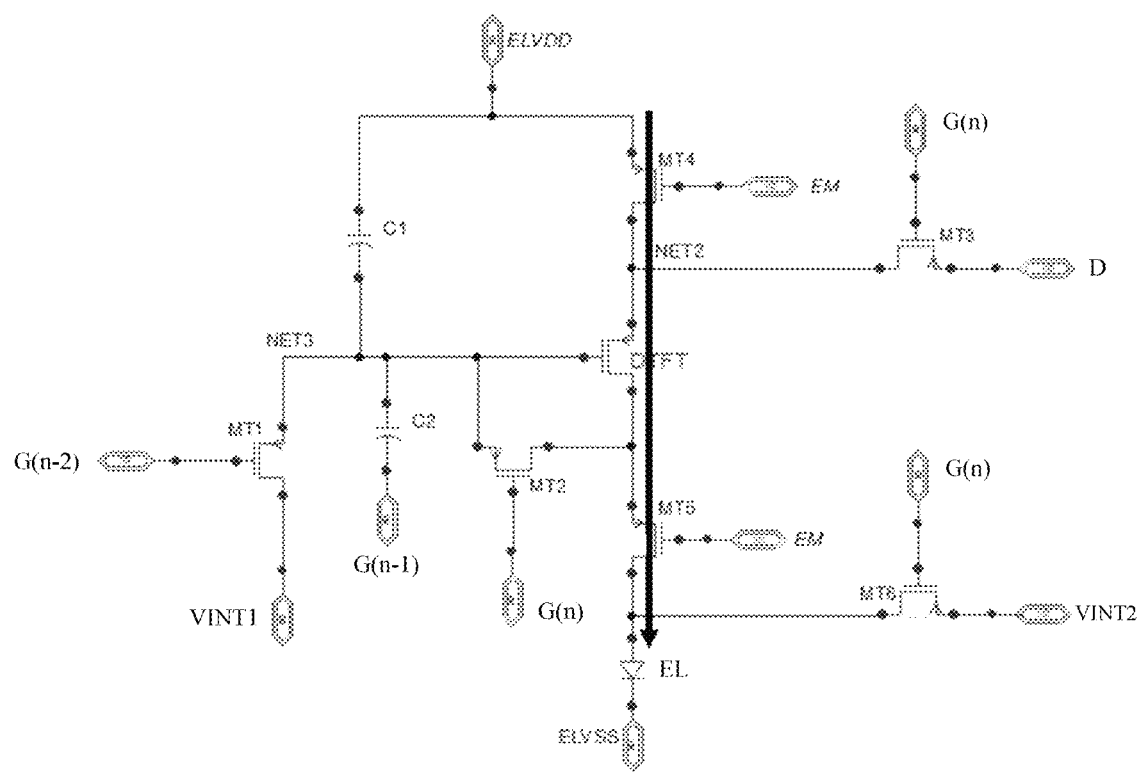

FIG. 3e is a schematic diagram of the pixel driving circuit in the light-emitting stage T14, and an arrow in the FIG. 3e indicates a signal flow direction.

For example, as shown in FIG. 3e, in the light-emitting stage T14, the scan signal output from the current scan line G(n) is a high level voltage signal, the scan signal output from the pre-previous scan line G(n−2) is a high level voltage signal, the scan signal output from the previous scan line G(n−1) is a high level voltage signal, and the light-emitting control signal output from the light-emitting control terminal EM is a low level voltage signal, so that the first transistor MT1, the second transistor MT2, the third transistor MT3, and the sixth transistor MT6 are all turned off, and the fourth transistor MT4, the driving transistor DTFT, and the fifth transistor MT5 are all turned on. The driving current is transmitted to the first electrode of the light-emitting component EL via the fourth transistor MT4, the driving transistor DTFT, and the fifth transistor MT5, so that the light-emitting component EL emits light.

In summary, after the reset stage T11, the gate-source voltage adjustment stage T12, the threshold compensation stage T13, and the light-emitting stage T14, pixel driving in one frame is completed.

It should be noted that, the time sequence diagram of the pixel driving circuit can be designed according to actual needs, and the embodiments of the present disclosure do not specifically limit the time sequence diagram.

Figure 4:
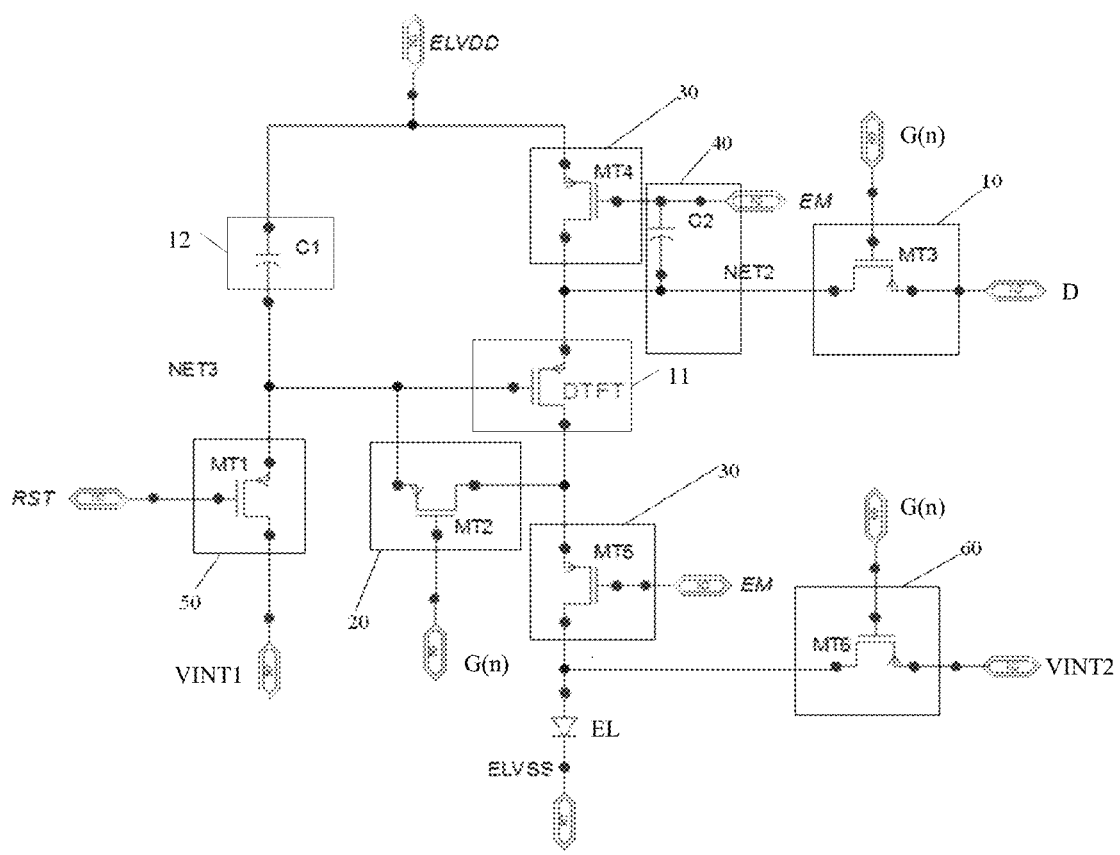
FIG. 4 is a circuit diagram of a pixel driving circuit provided by another embodiment of the present disclosure.

FIG. 4 is a circuit diagram of a pixel driving circuit provided by another embodiment of the present disclosure. Referring to FIG. 4, compared with the pixel driving circuit provided in the above embodiment shown in FIG. 3, the pixel driving circuit shown in FIG. 4 similarly comprises: a data writing circuit 10, a threshold compensation circuit 20, a light-emitting control circuit 30, a light-emitting driving circuit 11, a light-emitting component EL, a storage circuit 12, a gate-source voltage adjustment circuit 40, a first reset circuit 50 and a second reset circuit 60. Because the data writing circuit 10, the threshold compensation circuit 20, the light-emitting control circuit 30, the light-emitting driving circuit 11, the light-emitting component EL, the storage circuit 12, the first reset circuit 50 and the second reset circuit 60 have been described in detail in the above embodiment shown in FIG. 3, similar descriptions will be omitted here.

Differences between an embodiment shown in FIG. 4 and the above-described embodiment shown in FIG. 3 will be described below.

For example, in the embodiment shown in FIG. 4, the gate-source voltage adjustment circuit 40 comprises a gate-source voltage adjustment capacitor C2. An adjustment voltage terminal is electrically connected with a light-emitting control terminal EM that outputs a light-emitting control signal; a first end of the gate-source voltage adjustment capacitor C2 is electrically connected with a second node NET2, and a second end of the gate-source voltage adjustment capacitor C2 is electrically connected with the adjustment voltage terminal.

A control end of the first reset circuit 50 is electrically connected with a reset terminal RST, a first end of the first reset circuit 50 is electrically connected with a first level terminal VINT1, and a second end of the first reset circuit 50 is electrically connected with the first node NET3. The first reset circuit 50 is used to load a voltage of a first level terminal VINT1 to the first node NET3 under control of a reset signal output from the reset terminal RST.

For example, as shown in FIG. 4, the first reset circuit 50 comprises a first transistor MT1. A control electrode of the first transistor MT1 acts as the control end of the first reset circuit 50; a first electrode and a second electrode of the first transistor MT1 act as the first end and the second end of the first reset circuit 50 respectively. That is, the control electrode of the first transistor MT1 is electrically connected with the reset terminal RST, and the first electrode and the second electrode of the first transistor MT1 are electrically connected with the first level terminal VINT1 and the first node NET3 respectively.

Figure 5:
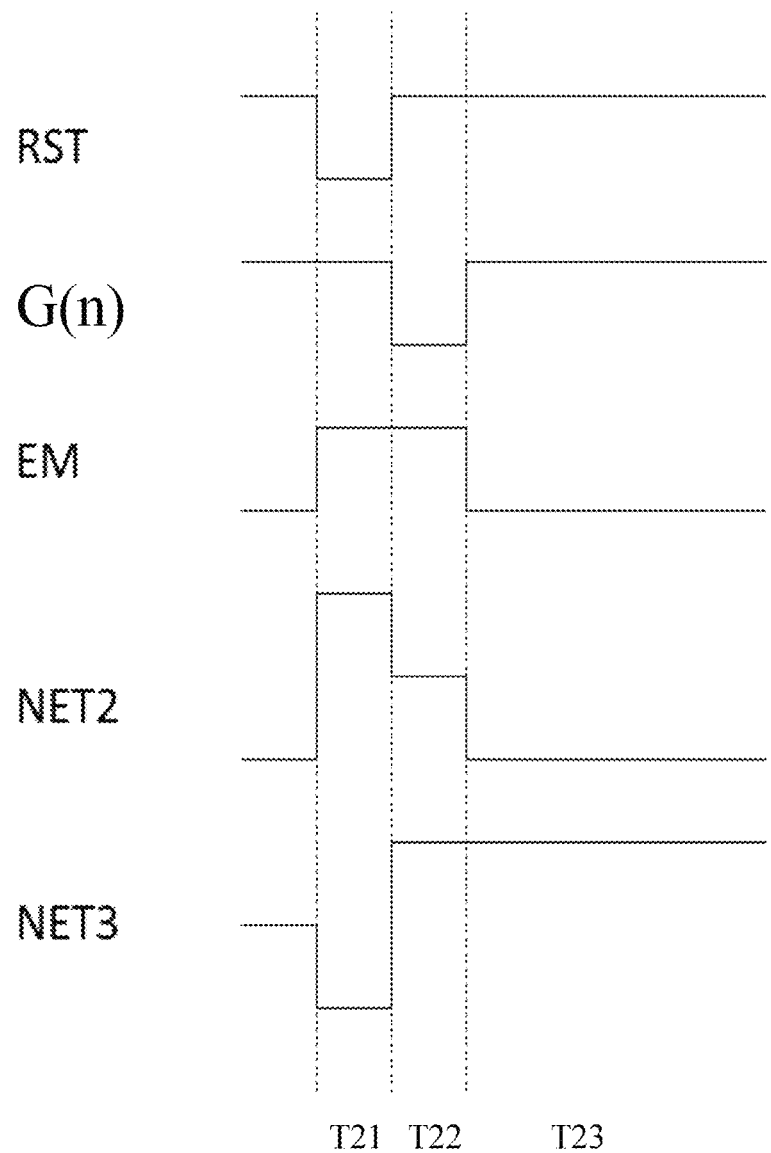
FIG. 5 is a time sequence diagram of the pixel driving circuit shown in FIG. 4.

FIG. 5 is a time sequence diagram of a pixel driving circuit shown in FIG. 4, and a driving method of the pixel driving circuit provided by another embodiment of the present disclosure is described in detail in conjunction with FIG. 4 and FIG. 5.

For example, the driving method provide by another embodiment of the present disclosure comprises the following steps:

in a gate-source voltage adjustment stage T21, adjusting at least one of a voltage of the first node and a voltage of the second node, so as to increase a modulus value of a voltage difference between the control end and the first end of the light-emitting driving circuit;

in a threshold compensation stage T22, writing a threshold compensation signal to the control end (namely the first node) of the light-emitting driving circuit through a threshold compensation circuit, to perform threshold compensation on the light-emitting driving circuit; and in a light-emitting stage T23, controlling a driving current generated by the light-emitting driving circuit to drive the light-emitting component to emit light.

For example, in the gate-source voltage adjustment stage T21, a reset signal output from the reset terminal RST is a low level voltage signal, a scan signal output from the current scan line G(n) is a high level voltage signal, and a light-emitting control signal output from the light-emitting control terminal EM is a high level voltage signal, so that the first transistor MT1 is turned on, and other transistors (that is, the second transistor MT2 to the sixth transistor MT6) and the driving transistor DTFT are all turned off. At this time, a first reset voltage Vi1 output from the first level terminal VINT1 is transmitted to the control electrode (that is, the first node NET3) of the driving transistor DTFT through the first transistor MT1, so that the control electrode of the driving transistor DTFT is reset. At this time, the gate voltage Vg of the driving transistor DTFT is equal to the first reset voltage Vi1, that is, Vg=Vi1. Meanwhile, the first reset voltage Vi1 output from the first level terminal VINT1 charges the storage capacitor C1 through the first transistor MT1, that is, the first reset voltage Vi1 is written into the first end of the storage capacitor C1. The voltage of the second node NET2 is pulled up by Vgh'−Vgl' due to the existence of the gate-source voltage adjustment capacitor C2, and if the Vgl' is a negative voltage, the voltage of the second node NET2 is pulled up by Vgh'+|Vgl'|. If the voltage of the second node NET2 is 0V before the gate-source voltage adjustment stage T21, then in the gate-source voltage adjustment stage T21, the voltage of the second node NET2 is Vgh'+|Vgl'|, that is, the source voltage of the driving transistor DTFT is Vs=Vgh'+|Vgl'|, and here, Vgh' represents a high level voltage signal in the light-emitting control signal output from the light-emitting control terminal EM, and Vgl' represents a low level voltage signal in the light-emitting control signal output from the light-emitting control terminal EM. Therefore, the source voltage Vs of the driving transistor DTFT is pulled up, the gate-source voltage Vgs is increased, and movable ions (that is, charges) at the surface between the active layer ACT and the gate insulating layer GI of the driving transistor DTFT can be eliminated in a relative short time, so that the driving transistor can be stabilized more quickly, thereby ameliorating the short-term afterimage of the display panel.

For example, in the threshold compensation stage T22, the reset signal output from the reset terminal RST is a high level voltage signal, the scan signal output from the current scan line G(n) is a low level voltage signal, and the light-emitting control signal output from the light-emitting control terminal EM is a high level voltage signal, so that the second transistor MT2, the driving transistor DTFT, the third transistor MT3 and the sixth transistor MT6 are all turned on, and the first transistor MT1, the fourth transistor MT4 and the fifth transistor MT5 are all turned off. At this time, the data signal on the data line D continues to charge the first node NET3 via the third transistor MT3, the driving transistor DTFT, and the second transistor MT2. When the voltage of the first node NET3 is equal to the sum of the data signal and the threshold voltage of the driving transistor DTFT, the charging of the first node NET3 is stopped, and at this time, the gate voltage of the driving transistor DTFT is Vg=Vdata+Vth, so as to achieve compensation for the threshold voltage of the driving transistor DTFT. Meanwhile, because the sixth transistor MT6 is also turned on, a second reset voltage Vi2 output from a second level terminal VINT2 is transmitted to the first electrode of the light-emitting component EL through the sixth transistor MT6, so that the first electrode of the light-emitting component EL is reset, and at this time, the voltage of the first electrode of the light-emitting component EL is equal to the second reset voltage Vi2.

For example, the first reset voltage Vi1 and the second reset voltage Vi2 may be the same.

For example, in the light-emitting stage T23, the reset signal output from the reset terminal RST is a high level voltage signal, the scan signal output from the current scan line G(n) is a high level voltage signal, and the light-emitting control signal output from the light-emitting control terminal EM is a low level voltage signal, so that the first transistor MT1, the second transistor MT2, the third transistor MT3, and the sixth transistor MT6 are all turned off, and the fourth transistor MT4, the driving transistor DTFT, and the fifth transistor MT5 are all turned on. The driving current is transmitted to the first electrode of the light-emitting component EL via the fourth transistor MT4, the driving transistor DTFT, and the fifth transistor MT5, so that the light-emitting component EL emits light.

In summary, after the gate-source voltage adjustment stage T21, the threshold compensation stage T22, and the light-emitting stage T23, pixel driving in one frame is completed.

It is worth to note that, in conjunction with FIG. 2 and FIG. 4, the pixel driving circuit provided by an embodiment of the present disclosure may also comprise both the gate-source voltage adjustment circuit shown in FIG. 2 (referred to as a first gate-source voltage adjustment circuit for short) and the gate-source voltage adjustment circuit shown in FIG. 4 (referred to as a second gate-source voltage adjustment circuit for short). Two ends of the first gate-source voltage adjustment circuit are electrically connected with the first node and the previous scan line G(n−1) respectively, the first gate-source voltage adjustment circuit comprises a first gate-source voltage adjustment capacitor C2, and the first gate-source voltage adjustment circuit is configured to adjust the voltage of the first node. Two ends of the second gate-source voltage adjustment circuit are electrically connected with the second node and the light-emitting control terminal EM respectively, the second gate-source voltage adjustment circuit comprises a second gate-source voltage adjustment capacitor C2, and the second gate-source voltage adjustment circuit is configured to adjust the voltage of the second node. Because the pixel driving circuit comprises two gate-source voltage adjustment circuits at the same time, the voltage of the first node and the voltage of the second node can be adjusted at the same time. Therefore, the modulus value of the voltage difference between the control end and the first end of the light-emitting driving circuit can be increased more quickly.

Figure 6:
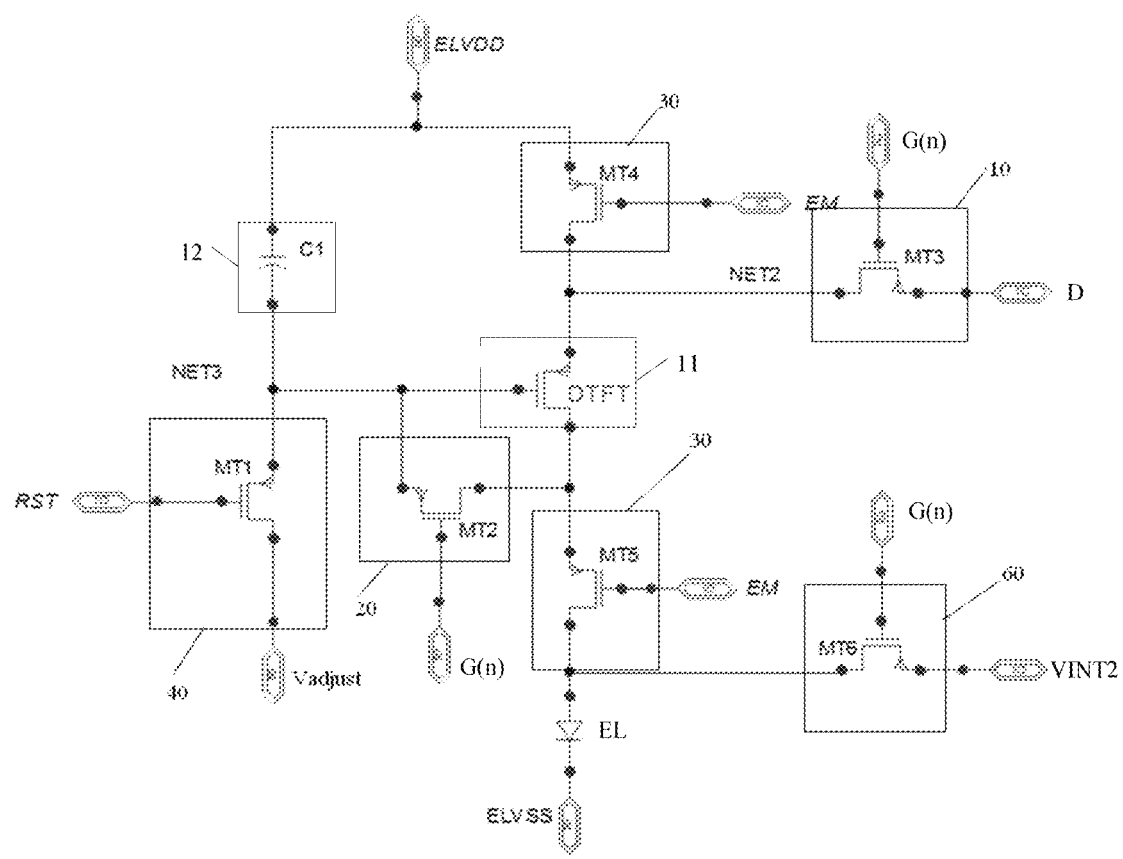
FIG. 6 is a circuit diagram of a pixel driving circuit provided by still another embodiment of the present disclosure.

FIG. 6 is a circuit diagram of a pixel driving circuit provided by still another embodiment of the present disclosure. Referring to FIG. 6, compared with the pixel driving circuit provided in the above embodiments, the pixel driving circuit shown in FIG. 6 similarly comprises: a data writing circuit 10, a threshold compensation circuit 20, a light-emitting control circuit 30, a light-emitting driving circuit 11, a light-emitting component EL, a storage circuit 12, a gate-source voltage adjustment circuit 40 and a second reset circuit 60. Because the data writing circuit 10, the threshold compensation circuit 20, the light-emitting control circuit 30, the light-emitting driving circuit 11, the light-emitting component EL, the storage circuit 12 and the second reset circuit 60 have been described in detail in the above embodiments, similar descriptions will be omitted here.

Differences between an embodiment shown in FIG. 6 and the above-described embodiments will be described below.

For example, in the embodiment shown in FIG. 6, the gate-source voltage adjustment circuit 40 comprises a first transistor MT1. A control electrode of the first transistor MT1 is electrically connected with the reset terminal RST, a second electrode of the first transistor MT1 is electrically connected with the first node NET3, and a first electrode of the first transistor MT1 is electrically connected with an adjustment voltage terminal Vadjust. The first transistor MT1 is used to load a voltage of the adjustment voltage terminal Vadjust to the first node NET3 under control of a reset signal output from the reset terminal RST.

Figure 7:
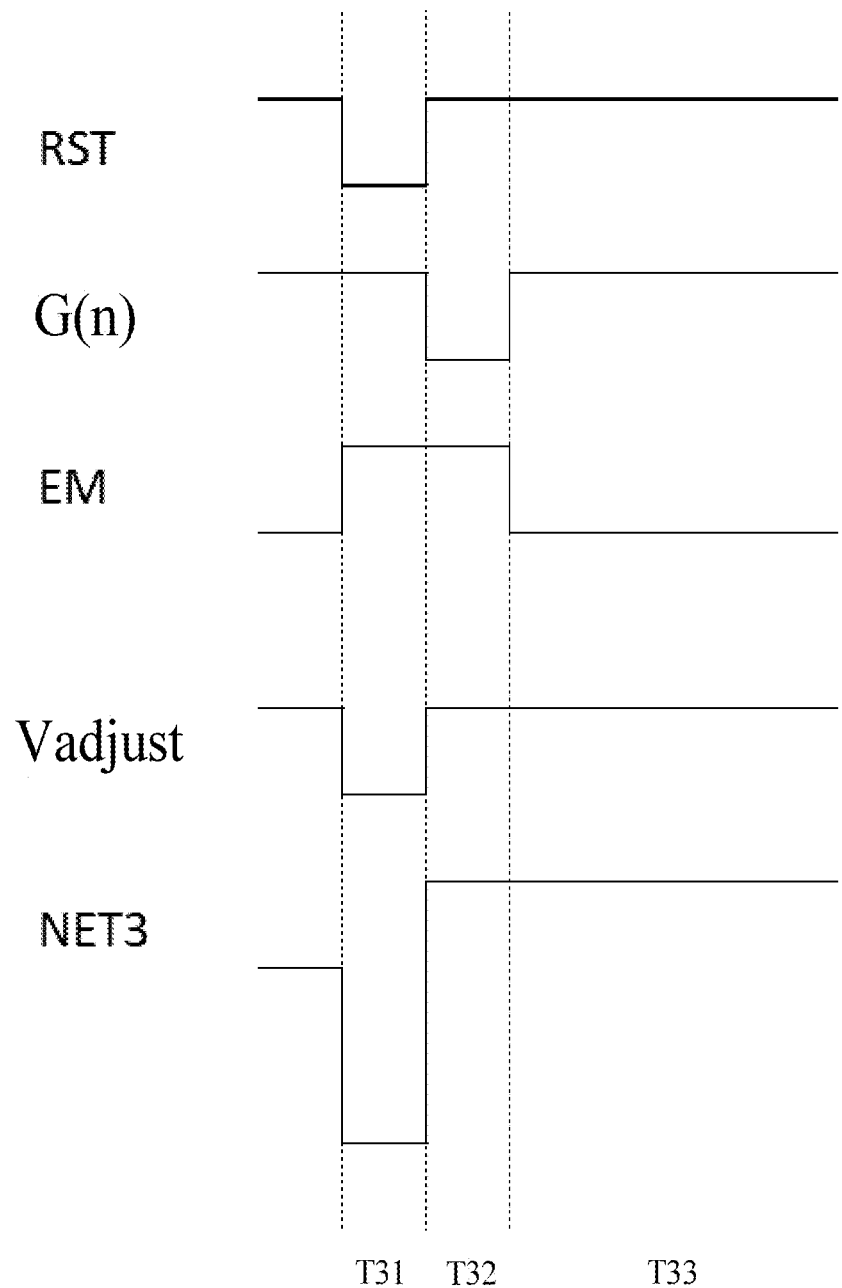
FIG. 7 is a time sequence diagram of the pixel driving circuit shown in FIG. 6.

FIG. 7 is a time sequence diagram of a pixel driving circuit shown in FIG. 6, and a driving method of the pixel driving circuit provided by still another embodiment of the present disclosure is described in detail in conjunction with FIG. 6 and FIG. 7.

For example, the driving method provided by still another embodiment of the present disclosure comprises the following steps:

in a gate-source voltage adjustment stage T31, adjusting at least one of a voltage of the first node and a voltage of the second node, so as to increase a modulus value of a voltage difference between the control end and the first end of the light-emitting driving circuit;

in a threshold compensation stage T32, writing a threshold compensation signal to the control end (namely the first node) of the light-emitting driving circuit through a threshold compensation circuit, to perform threshold compensation on the light-emitting driving circuit; and in a light-emitting stage T33, controlling a driving current generated by the light-emitting driving circuit to drive the light-emitting component to emit light.

For example, in the gate-source voltage adjustment stage T31, a reset signal output from the reset terminal RST is a low level voltage signal, a scan signal output from the current scan line G(n) is a high level voltage signal, and a light-emitting control signal output from the light-emitting control terminal EM is a high level voltage signal, so that the first transistor MT1 is turned on, and other transistors (that is, the second transistor MT2 to the sixth transistor MT6) and the driving transistor DTFT are all turned off. At this time, an adjustment voltage signal Lvgl output from the adjustment voltage terminal Vadjust is transmitted to the control electrode (that is, the first node NET3) of the driving transistor DTFT through the first transistor MT1, so that the control electrode of the driving transistor DTFT is reset. At this time, the gate voltage Vg of the driving transistor DTFT is equal to the adjustment voltage signal Lvgl, that is, Vg=Lvgl. Compared with the threshold compensation stage T32 and the light-emitting stage T33, in the gate-source voltage adjustment stage T31, the adjustment voltage signal Lvgl is lower (for example, in the threshold compensation stage T32 and the light-emitting stage T33, the adjustment voltage signal Lvgl is −2V; however in the gate-source voltage adjustment stage T31, the adjustment voltage signal Lvgl is −4V), so that the gate voltage Vg of the driving transistor DTFT is further decreased, the gate-source voltage Vgs is increased, and the movable ions (that is, charges) at the surface between the active layer ACT and the gate insulating layer GI of the driving transistor DTFT can be eliminated in a shorter time, so that the driving transistor DTFT can be stabilized more quickly, thereby ameliorating the short-term afterimage of the display panel.

For example, in the threshold compensation stage T32, the reset signal output from the reset terminal RST is a high level voltage signal, the scan signal output from the current scan line G(n) is a low level voltage signal, and the light-emitting control signal output from the light-emitting control terminal EM is a high level voltage signal, so that the second transistor MT2, the driving transistor DTFT, the third transistor MT3 and the sixth transistor MT6 are all turned on, and the first transistor MT1, the fourth transistor MT4 and the fifth transistor MT5 are all turned off. At this time, the data signal on the data line D continues to charge the first node NET3 via the third transistor MT3, the driving transistor DTFT, and the second transistor MT2. When the voltage of the first node NET3 is equal to the sum of the data signal and the threshold voltage of the driving transistor DTFT, the charging of the first node NET3 is stopped, and at this time, the gate voltage of the driving transistor DTFT is Vg=Vdata+Vth, so as to achieve compensation for the threshold voltage of the driving transistor DTFT. Meanwhile, because the sixth transistor MT6 is also turned on, a second reset voltage Vi2 output from a second level terminal VINT2 is transmitted to the first electrode of the light-emitting component EL through the sixth transistor MT6, so that the first electrode of the light-emitting component EL is reset, and at this time, the voltage of the first electrode of the light-emitting component EL is equal to the second reset voltage Vi2.

For example, in the light-emitting stage T23, the reset signal output from the reset terminal RST is a high level voltage signal, the scan signal output from the current scan line G(n) is a high level voltage signal, and the light-emitting control signal output from the light-emitting control terminal EM is a low level voltage signal, so that the first transistor MT1, the second transistor MT2, the third transistor MT3, and the sixth transistor MT6 are all turned off, and the fourth transistor MT4, the driving transistor DTFT, and the fifth transistor MT5 are all turned on. The driving current is transmitted to the first electrode of the light-emitting component EL via the fourth transistor MT4, the driving transistor DTFT, and the fifth transistor MT5, so that the light-emitting component EL emits light.

In summary, after the gate-source voltage adjustment stage T31, the threshold compensation stage T32, and the light-emitting stage T33, pixel driving in one frame is completed.

For example, a voltage signal on the adjustment voltage terminal Vadjust is a variable voltage signal. For example, the voltage signal of the adjustment voltage terminal Vadjust in the gate-source voltage adjustment stage T31 may be different from the voltage signal of the adjustment voltage terminal Vadjust in the threshold compensation stage T32 and in the light-emitting stage T33. In the gate-source voltage adjustment stage T31, the voltage signal of the adjustment voltage terminal Vadjust may be −4V, and in the threshold compensation stage T32 and in the light-emitting stage T33, the voltage signal of the adjustment voltage terminal Vadjust may be −2V.

An embodiment of the present disclosure further provides a display device, which comprises a pixel driving circuit described in any one of the above embodiments.

In the display device provided by the embodiments of the present disclosure, by using the pixel driving circuit described in any one of the above embodiments, the duration of the afterimages when switching to the non-solid display image in the display process of the display device can be greatly shortened, so as to improve the display effect of the display device.

The display device provided by the present disclosure can be a mobile phone, a tablet, a television, a monitor, a notebook computer, a digital photo frame, a navigator, or any products or components having a display function.

Figure 8:
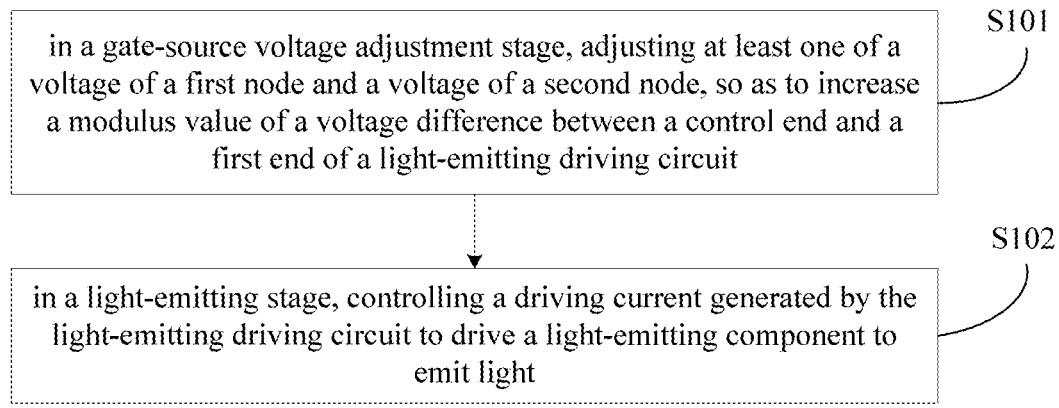
FIG. 8 is a flow chart of a driving method for driving a pixel driving circuit provided by an embodiment of the present disclosure.

FIG. 8 is a flow chart of a driving method for driving a pixel driving circuit provided by an embodiment of the present disclosure. For example, as shown in FIG. 8, an embodiment of the present disclosure further provides a driving method of the pixel driving circuit according to any one of the above embodiments, comprising the following steps:

S101: in a gate-source voltage adjustment stage, adjusting at least one of a voltage of a first node and a voltage of a second node, so as to increase a modulus value of a voltage difference between a control end and a first end of a light-emitting driving circuit; and S102: in a light-emitting stage, controlling a driving current generated by the light-emitting driving circuit to drive a light-emitting component to emit light.

For example, the driving method further comprises: in a threshold compensation stage, writing a threshold compensation signal to the control end of the light-emitting driving circuit through a threshold compensation circuit, to perform threshold compensation on the light-emitting driving circuit.

Detailed descriptions of the driving method provided by the embodiments of the present disclosure can be referred to in the related descriptions in the embodiments of the pixel driving circuit described above, and similar descriptions will be omitted here.

For the present disclosure, the following statements should be noted:

(1) the accompanying drawings involve only the structure(s) in connection with the embodiment(s) of the present disclosure, and other structure(s) can be referred to in common design(s); and (2) in case of no conflict, the embodiments of the present disclosure and the features in the embodiment(s) can be combined with each other to obtain new embodiment(s).

What have been described above are only specific implementations of the present disclosure, the protection scope of the present disclosure is not limited thereto, and the protection scope of the present disclosure should be based on the protection scope of the claims.

What is claimed is:

1. A pixel driving circuit, comprising: a light-emitting driving circuit, a light-emitting component, a gate-source voltage adjustment circuit, a data writing circuit, and a storage circuit, wherein:

a control end of the light-emitting driving circuit is electrically connected with a first node, a first end of the light-emitting driving circuit is electrically connected with a second node, and a second end of the light-emitting driving circuit is electrically connected with the light-emitting component;

the gate-source voltage adjustment circuit is electrically connected with at least one of the first node and the second node, the gate-source voltage adjustment circuit is also electrically connected with an adjustment voltage terminal, and the gate-source voltage adjustment circuit is configured to adjust at least one of a voltage of the first node and a voltage of the second node, so as to increase a modulus value of a voltage difference between the control end and the first end of the light-emitting driving circuit;

the data writing circuit is configured to write a data signal to the first end of the light-emitting driving circuit under control of a scan signal output from a current scan line; and the storage circuit is configured to store the data signal.

2. The pixel driving circuit according to claim 1, wherein the gate-source voltage adjustment circuit comprises a gate-source voltage adjustment capacitor;

a first end of the gate-source voltage adjustment capacitor is electrically connected with the first node, a second end of the gate-source voltage adjustment capacitor is electrically connected with the adjustment voltage terminal, and the adjustment voltage terminal is electrically connected with a previous scan line.

3. The pixel driving circuit according to claim 2, further comprising a first reset circuit;

wherein the first reset circuit is configured to load a voltage of a first level terminal to the first node under control of a scan signal output from a pre-previous scan line.

4. The pixel driving circuit according to claim 3, wherein the first reset circuit comprises a first transistor;

a control electrode of the first transistor is electrically connected with the pre-previous scan line, a first electrode of the first transistor is electrically connected with the first level terminal, and a second electrode of the first transistor is electrically connected with the first node.

5. The pixel driving circuit according to claim 1, wherein the gate-source voltage adjustment circuit comprises a gate-source voltage adjustment capacitor, the adjustment voltage terminal is electrically connected with a light-emitting control terminal which outputs a light-emitting control signal;

a first end of the gate-source voltage adjustment capacitor is electrically connected with the second node, and a second end of the gate-source voltage adjustment capacitor is electrically connected with the adjustment voltage terminal.

6. The pixel driving circuit according to claim 5, further comprising a first reset circuit;

wherein the first reset circuit is configured to load a voltage of a first level terminal to the first node under control of a reset signal output from a reset terminal.

7. The pixel driving circuit according to claim 6, wherein the first reset circuit comprises a first transistor, a control electrode of the first transistor is electrically connected with the reset terminal, a first electrode of the first transistor is electrically connected with the first level terminal, and a second electrode of the first transistor is electrically connected with the first node.

8. The pixel driving circuit according to claim 1, wherein the gate-source voltage adjustment circuit comprises a first transistor, and the first transistor is configured to load a voltage of the adjustment voltage terminal to the first node under control of a reset signal output from a reset terminal.

9. The pixel driving circuit according to claim 8, wherein a control electrode of the first transistor is electrically connected with the reset terminal, a first electrode of the first transistor is electrically connected with the adjustment voltage terminal, and a second electrode of the first transistor is electrically connected with the first node.

10. The pixel driving circuit according to claim 1 wherein the light-emitting driving circuit comprises a driving transistor, the storage circuit comprises a storage capacitor, and the data writing circuit comprises a third transistor;
the control end of the light-emitting driving circuit is a control electrode of the driving transistor, the first end of the light-emitting driving circuit is a first electrode of the driving transistor, and the second end of the light-emitting driving circuit is a second electrode of the driving transistor;
a first end of the storage capacitor is electrically connected with the first node, and a second end of the storage capacitor is electrically connected with a first power voltage terminal; and
a first electrode of the third transistor is electrically connected with a data line to receive the data signal, a second electrode of the third transistor is electrically connected with the second node, and a control electrode of the third transistor is electrically connected with the current scan line.

11. The pixel driving circuit according to claim 1, further comprising: a light-emitting control circuit,
wherein the light-emitting control circuit is configured to control a driving current generated by the light-emitting driving circuit to drive the light-emitting component to emit light under control of a light-emitting control signal.

12. The pixel driving circuit according to claim 11, wherein the light-emitting control circuit comprises a fourth transistor and a fifth transistor;
a control electrode of the fourth transistor is electrically connected with a light-emitting control terminal which outputs the light-emitting control signal, a first electrode of the fourth transistor is electrically connected with a first power voltage terminal, and a second electrode of the fourth transistor is electrically connected with the second node; and
a control electrode of the fifth transistor is electrically connected with the light-emitting control terminal which outputs the light-emitting control signal, a first electrode of the fifth transistor is electrically connected with the second end of the light-emitting driving circuit, and a second electrode of the fifth transistor is electrically connected with a first electrode of the light-emitting component.

13. The pixel driving circuit according to claim 11, further comprising: a threshold compensation circuit,
wherein the threshold compensation circuit is configured to perform threshold compensation on the light-emitting driving circuit under control of a scan signal output from a current scan line.

14. The pixel driving circuit according to claim 13, wherein the threshold compensation circuit comprises a second transistor,
a control electrode of the second transistor is electrically connected with the current scan line, a first electrode of the second transistor is electrically connected with the first node, and a second electrode of the second transistor is electrically connected with the second end of the light-emitting driving circuit.

15. The pixel driving circuit according to claim 1, further comprising: a second reset circuit;
wherein the second reset circuit is configured to load a voltage of a second level terminal to a first electrode of the light-emitting component under control of a scan signal output from a current scan line.

16. The pixel driving circuit according to claim 15, wherein the second reset circuit comprises a sixth transistor;
a control electrode of the sixth transistor is electrically connected with the current scan line, a first electrode of the sixth transistor is electrically connected with the second level terminal, and a second electrode of the sixth transistor is electrically connected with the first electrode of the light-emitting component.

17. A display device, comprising the pixel driving circuit according to claim 1.

18. A driving method of the pixel driving circuit according to claim 1, comprising:
in a gate-source voltage adjustment stage, adjusting at least one of the voltage of the first node and the voltage of the second node, so as to increase the modulus value of the voltage difference between the control end and the first end of the light-emitting driving circuit;
in a light-emitting stage, controlling a driving current generated by the light-emitting driving circuit to drive the light-emitting component to emit light.

19. The driving method according to claim 18, further comprising:
in a threshold compensation stage, writing a threshold compensation signal to the control end of the light-emitting driving circuit through a threshold compensation circuit, to perform threshold compensation on the light-emitting driving circuit.

* * * * *